United States Patent [19]
Nakajima et al.

[11] Patent Number: 5,886,488
[45] Date of Patent: Mar. 23, 1999

[54] SWING SUPPORT APPARATUS

[75] Inventors: Hisashi Nakajima, Yamanashi-ken; Masashi Shimizu, Kofo; Kazuhito Yokomori, Nirasaki, all of Japan

[73] Assignee: Tokyo Electron Limited, Tokyo, Japan

[21] Appl. No.: 850,748

[22] Filed: May 2, 1997

[30] Foreign Application Priority Data

May 9, 1996 [JP] Japan ................................... 8-139412

[51] Int. Cl.$^6$ ....................................................... H02P 7/00
[52] U.S. Cl. ........................... 318/432; 324/758; 318/646
[58] Field of Search ................................... 318/646, 647, 318/648, 649, 432, 63, 86, 87, 363, 364, 372, 376, 8, 9; 324/754, 758, 765

[56] References Cited

U.S. PATENT DOCUMENTS

| | | | |
|---|---|---|---|
| 3,801,959 | 4/1974 | O'Brien | 367/197 |
| 3,809,988 | 5/1974 | Motoda et al. | 318/646 |
| 4,215,410 | 7/1980 | Weslow et al. | 364/516 |
| 4,263,537 | 4/1981 | Bettin et al. | 318/561 |
| 4,318,625 | 3/1982 | Survant | 400/322 |
| 4,414,496 | 11/1983 | Watanabe et al. | 318/696 |
| 4,695,016 | 9/1987 | Worack | 246/415 A |
| 4,728,871 | 3/1988 | Andrews | 318/130 |
| 4,875,005 | 10/1989 | Terada et al. . | |
| 5,012,166 | 4/1991 | Ushijima et al. | 318/254 |
| 5,506,512 | 4/1996 | Tozawa et al. . | |

FOREIGN PATENT DOCUMENTS

6-11542  1/1994  Japan .

*Primary Examiner*—Jonathan Wysocki
*Attorney, Agent, or Firm*—Oblon, Spivak, McClelland, Maier & Neustadt, P.C.

[57] ABSTRACT

A mechanism for stopping an object to be swung in a predetermined stop position and holding the object in that position includes a temporary stopping unit for stopping the swing of the object in a temporary stop position before the stop position, a rotation complementing unit for complementarily further rotating the object from the temporary stop position to the stop position, and a holding unit for holding the object in the stop position. As a preferable embodiment of the rotation complementing means, it is possible to use a) a coupling unit for coupling a mounting member to a second power transmission wheel such that the mounting member can freely rotate in both the forward and reverse directions with respect to the second power transmission wheel, b) a rotation angle regulating unit for regulating the angle range within which the mounting member can freely rotate in the forward and reverse directions with respect to the second power transmission wheel, c) a mounting member pre-rotating unit for allowing a driving unit to rotate the mounting member within the angle range prior to the second power transmission wheel, and driving the second power transmission wheel after the mounting member stops rotating due to the rotation angle regulating unit, and d) a complementary torque apply unit for applying a complementary torque to the object in the temporary stop position and complementarily further rotating the object from the temporary stop position to the stop position.

20 Claims, 5 Drawing Sheets

SWING SUPPORT APPARATUS

BACKGROUND OF THE INVENTION

The present invention relates to a swing support apparatus for swingably supporting an object, e.g., a heavy object, and an object which has a testing device.

A swing support apparatus according to the present invention swingably supports a heavy object around its rotating shaft. For example, a test system necessitates a swing support apparatus for swingably supporting a testing device around its rotating shaft. As a typical application example, a test system (probe system) for performing a probe test in the field of semiconductors will be described below.

Conventional probe systems continuously perform electrical testing of a large number of IC chips formed on a semiconductor wafer. Generally, the probe system includes a loader unit and a prober unit. The loader unit has a transfer mechanism for transferring semiconductor wafers one by one, which are carried in and out in units of cassettes. The prober unit exchanges semiconductor wafers one by one with the transfer mechanism of the loader unit and performs electrical testing separately or continuously for a plurality of IC chips on a semiconductor wafer. This prober unit constitutes a main body of the probe system for performing a probe test and includes a wafer table, a contact mechanism (probe card), and a test head. The wafer table exchanges semiconductor wafers one by one with the transfer mechanism. The probe card has probe needles for connecting the electrodes or pads of an IC chip or chips on a semiconductor wafer to a test circuit. The test head electrically interfaces the probe card to the test circuit. This test head is fixed to a rotating shaft via a frame for supporting the test head main body and hinges. The test head is supported by the main body so as to turn, e.g., 180°, together with and around the rotating shaft, between the probe system main body and a maintenance area.

The test head incorporates a large number of electronic parts for electrically interfacing the probe card to the test circuit. The weight of the test head and its accessaries such as the frame reaches about 30 to 100 kg even if the test head is a small one. A motor is often used to swing the test head around the rotating shaft.

A large driving force is required to swing a heavy object such as the test head of the above conventional probe system. Since not only the motor but also gears for transmitting the driving force of the motor become large, it is necessary to increase the mechanical strength of the driving mechanism constituted by these members. Additionally, to prepare for a case where, e.g., the motor fails, a fall preventing mechanism (U.S. Pat. No. 5,506,512 issued Apr. 9, 1996) for preventing the fall of the test head is provided. This further complicates the structure of the swing support apparatus and increases the cost of the apparatus. Furthermore, it is difficult for the motor to accurately position the test head and bring the test head into contact with the contact mechanism such as a probe card without any overload. Therefore, a mechanically complicated positioning mechanism must be provided in addition to the motor, and this further increases the cost of the apparatus. These problems of positioning and holding are left unsolved.

To solve these problems, the invention proposed (Jpn. Pat. Appln. KOKAI Publication No. 6-11542 issued Jan. 21, 1994) uses a torque reducing means for reducing the torque applied on a rotating shaft by the weight of the test head of the above probe system.

With this prior art, it is possible to reduce the driving force required of the motor, smoothly swing an object to be swingably supported, and control inconveniences caused by the fall of the test head.

The problem of positioning, however, is still left unsolved.

BRIEF SUMMARY OF THE INVENTION

The present invention has been made to solve the above problems and has as its object to provide a swing support apparatus which uses the advantage of the above prior art that a torque reducing means for reducing the torque acting on a rotating shaft is used to reduce the driving force required of a motor and smoothly support and swing a heavy object, which can accurately position an object to be swingably supported, e.g., a test head, in a predetermined swing position, and which can be manufactured with an extremely simple and inexpensive mechanism, and to provide a test system using this swing support apparatus.

A swing support apparatus according to the invention described in claims 1 to 10 of the present application comprises an apparatus main body, an object to be swingably supported which is swung around the apparatus main body, a rotating shaft fixed to the object, support means for rotatably supporting the rotating shaft on the apparatus main body, driving means for rotating the rotating shaft such that the object swings between a swing start position separated from the apparatus main body and a swing stop position close to the apparatus main body, torque reducing means for reducing a torque applied on the rotating shaft by he object, temporary stopping means for temporarily stopping the swing of the object in a temporary stop position before the swing stop position, rotation complementing means for complementarily further rotating the object from the temporary stop position to the swing stop position, and holding means for holding the object in the swing stop position.

A swing support apparatus according to the invention described in claims 11 to 20 of the present application comprises an apparatus main body, an object to be swingably supported which is swung around the apparatus main body and has a testing device, a rotating shaft fixed to the object, support means for rotatably supporting the rotating shaft on the apparatus main body, driving means for rotating the rotating shaft such that the object swings between a swing start position separated from the apparatus main body and a swing stop position close to the apparatus main body, torque reducing means for reducing a torque applied on the rotating shaft by the object, temporary stopping means for temporarily stopping the swing of the object in a temporary stop position before the stop position, rotation complementing means for complementarily further rotating the object from the temporary stop position to the swing stop position, and holding means for holding the object in the swing stop position.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention

DETAILED DESCRIPTION OF THE INVENTION

FIGS. 1 to 5 illustrate one embodiment of the present invention in which a swing support apparatus of the present invention is applied to a test system (probe system) for performing a probe test.

Figure 1:
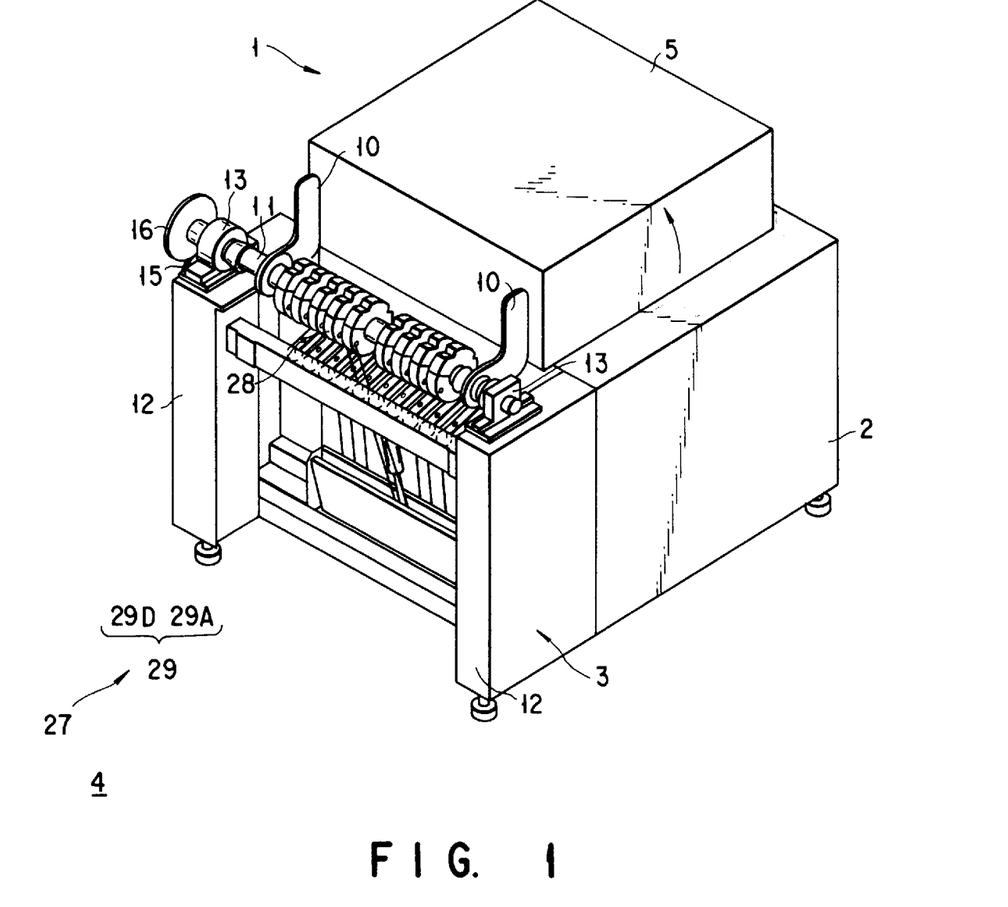
FIG. 1 is a perspective view showing the main parts of a probe system equipped with a torque reducing mechanism to which the present invention is applied.
Figure 2A:
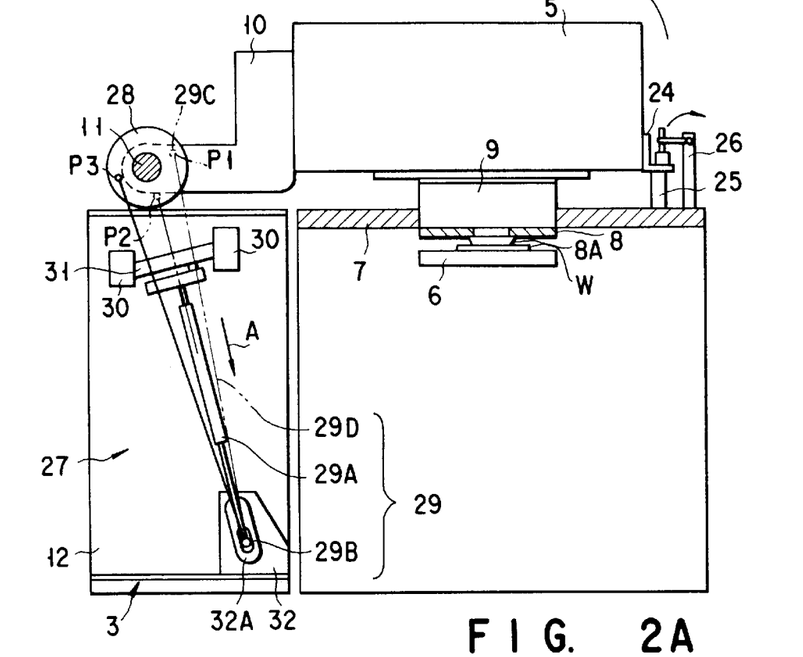
FIG. 2A is a front view showing the internal arrangement of the probe system shown in FIG. 1 and a rotation complementing means and a holding means according to the present invention.

As shown in FIGS. 1 and 2A, a probe system 1 of this embodiment comprises a probe system main body 2, a swing support apparatus 3, and a test head 5. The probe system main body 2 constitutes a prober unit for electrically testing an object to be tested, e.g., a semiconductor wafer W. The swing support apparatus 3 is arranged adjacent to the left side of the probe system main body 2. The test head 5 is an object to be swingably supported which is turned nearly 180° between the probe system main body 2 and a maintenance area 4 by the swing support apparatus 3, and is also a testing device. Although not shown, a loader unit is arranged adjacent to the right side of the probe system main body 2. This loader unit stores the semiconductor wafers W in units of cassettes and loads and unloads these semiconductor wafers W one by one onto and from the prober unit. As shown in FIG. 2A, a wafer table 6 for placing the semiconductor wafer W on it is arranged in the probe system main body 2. The wafer table 6 moves in the X, Y, Z, and q directions via another table (not shown) and positions the semiconductor wafer W in a predetermined test position. A contact mechanism (probe card) 8 is attached to a central hole of a head plate 7 which forms the ceiling of the probe system main body 2. When the test head 5 turns and comes to a position on the probe system main body 2, the test head 5 is electrically connected to connection terminals on the upper surface of the probe card 8 through a connection ring 9. Accordingly, the probe system 1 sends a test signal from a tester (not shown) to the electrodes of the semiconductor wafer W placed on the wafer table 6 via the test head 5, the connection terminals on the upper surface of the probe card 8, and probe needles 8A of the probe card 8, thereby electrically testing an IC chip or chips on the semiconductor wafer W.

Figure 3:
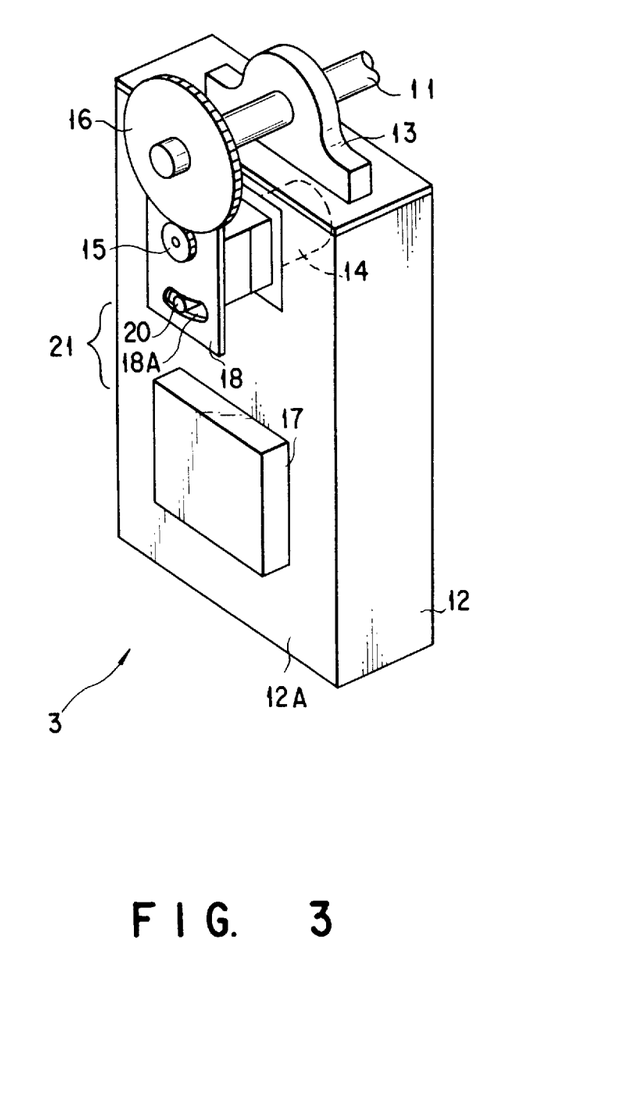
FIG. 3 is a perspective view showing a mounting member pre-rotating means in the probe system shown in FIG. 1.
Figure 4:
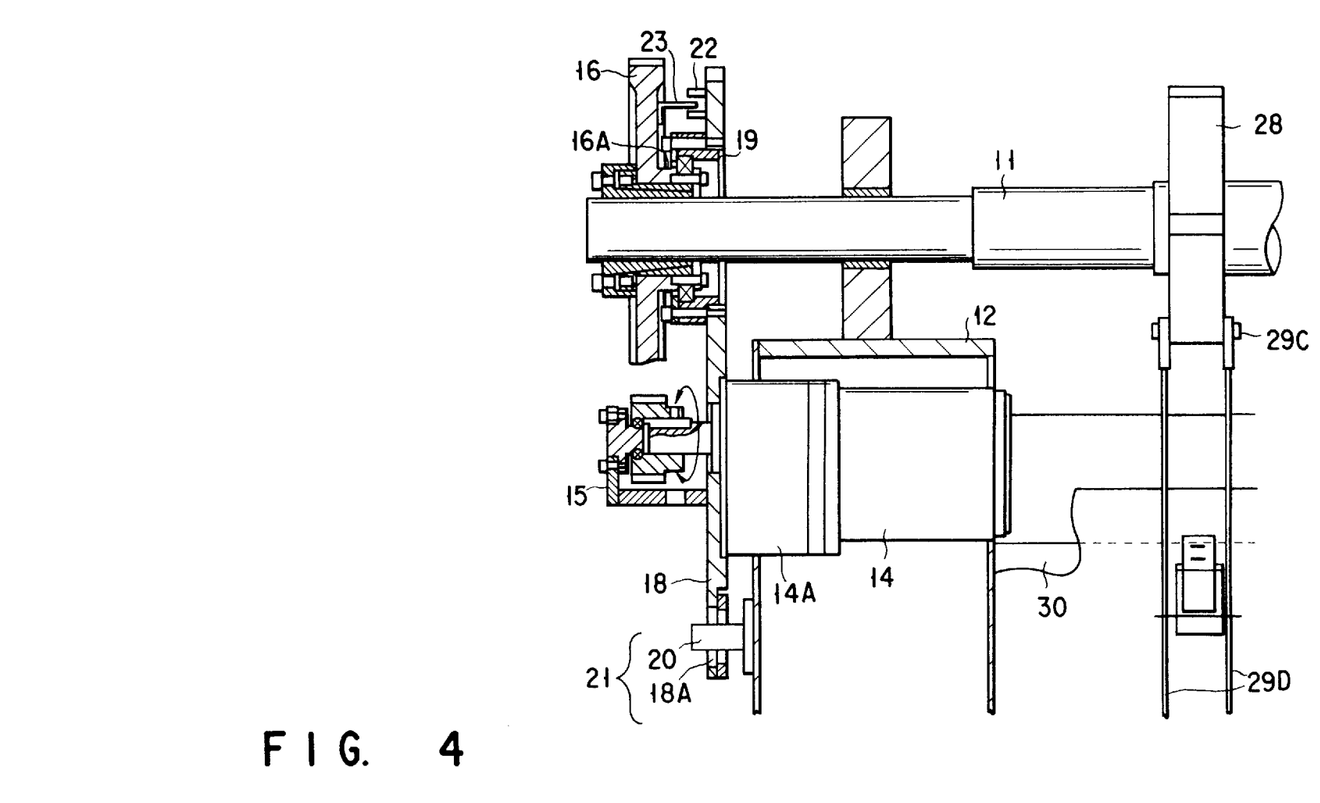
FIG. 4 is a partially cutaway view of FIG. 3, which shows the way the mounting member pre-rotating means is assembled.

As shown in FIGS. 1 and 2A, the test head 5 is fixed to a rotating shaft 11 via a pair of hinges 10 and so supported as to be swingable together with the rotating shaft 11. As shown in FIG. 1, the two ends of the rotating shaft 11 are axially supported by bearings 13 disposed on a pair of support bases 12. Also, as shown in FIGS. 3 and 4, a motor 14 with an electromagnetic brake 14A is incorporated into one support base 12. The motor 14 is used as a driving means for rotating the rotating shaft 11, and the electromagnetic brake is used to stop the rotation of the rotating shaft. That is, as shown in FIG. 3, a small gear 15 as a second power transmission wheel is fixed to the end of the driving shaft of the motor 14. A large gear 16 as a first power transmission wheel fixed to one end of the rotating shaft 11 meshes with the small gear 15. The driving force of the motor 14 is transmitted to the rotating shaft 11 via the small and large gears 15 and 16, thereby swinging the test head 5. The motor 14 and the electromagnetic brake 14A are driven under the control of a controller 17 arranged on the support base 12.

Figure 2B:
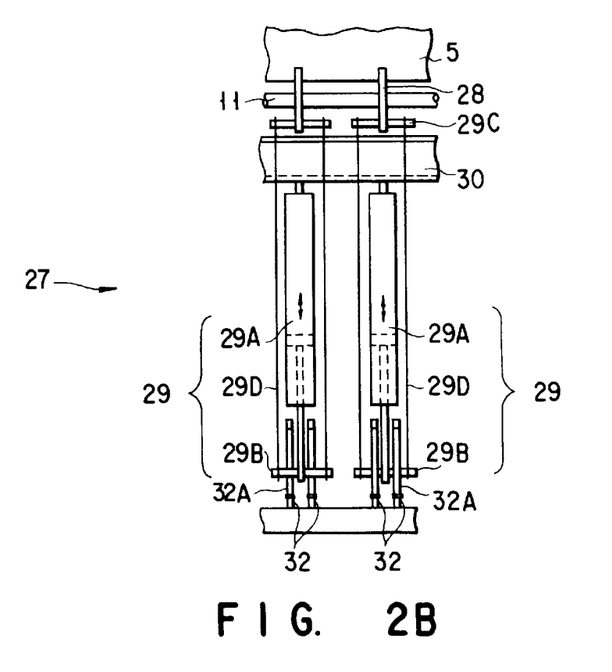
FIG. 2B is a side view showing a load reducing mechanism shown in FIG. 2A from the left side of FIG. 2A.

As shown in FIGS. 1, 2A, and 2B, the probe system 1 further includes a torque reducing mechanism 27 for reducing the torque applied on the driving shaft of the motor 14 by the weight of an object to be swung. This torque reducing mechanism 27 includes of a plurality of fixed members (e.g., flanges) 28 fixed on the rotating shaft 11 and spring mechanisms 29 provided in a one-to-one correspondence with these fixed members. FIG. 1 shows only one spring mechanism 29 for simplicity. Each spring mechanism 29 cancels the torque applied on the flange 28 by the weight of the test head 5. The spring mechanism 29 includes a gas spring 29A, a pin 29B, a pin 29C, and a pair of connecting members (e.g., tough wires) 29D. The gas spring 29A is arranged along a direction perpendicular to the rotating shaft 11 so that the upper portion of the gas spring 29A is slightly inclined outward. The pin 29B is fixed through a plate formed at the end of a piston rod of the gas spring 29A. The pin 29C extends through the flange 28. The wires 29D connect the two ends of the pin 29B to the two ends of the pin 29C.

As shown in FIGS. 1 and 2A, two support beams 30 span at different heights below and parallel to the rotating shaft 11 between the support bases 12. Also, a support member 31 for pivotally supporting the upper end of a cylinder of the gas spring 29A spans between the two support beams 30. A pair of guide plates are disposed below support members 32. Elongated holes 32A of these guide plates slidably support the two ends of the pin 29B at the lower end of the piston rod of the gas spring 29A pivotally fixed to the support members 32.

Accordingly, when the test head 5 is swung by the driving force of the motor 14, the gas spring 29A gives the wires 29D a tensile force by the piston rod biased by the gas pressure of a high-pressure gas, e.g., high-pressure air, in the cylinder. This tensile force applies a torque to the rotating shaft 11 via the flange 28, canceling the torque by the weight of the test head and reducing the driving force of the motor 14.

As shown in FIGS. 3 and 4, the motor 14 is fixed to a mounting plate 18 as a mounting member. A loose fit hole in which a boss 16A of the large gear 16 is loosely fitted is formed in the upper portion of the mounting plate 18. A bearing 19 is interposed between the boss 16A and the loose fit hole to constitute a coupling means by which the mounting plate 18 can freely rotate in both the forward and reverse directions with respect to the large gear 16 via the bearing 19. As shown in FIGS. 3 and 4, an arcuated elongated hole 18A is formed in the lower portion of the mounting plate 18. A side plate 12A is attached to the support base 12, and a positioning pin 20 is formed on the side plate 12A so as to be loosely fitted in the elongated hole 18A, thereby constituting a rotation angle regulating means.

This rotation angle regulating means cooperates with the coupling means to constitute a mounting member pre-rotating means 21. This mounting member pre-rotating means operates as follows. When the motor 14 is driven, the mounting plate 18 rotates prior to the large gear 16 until the positioning pin 20 engages with one end of the elongated hole 18A. Thereafter, the large gear 16 rotates, and the test head 5 starts swinging together with the rotating shaft of the large gear 16. In this manner, the rotation angle regulating means cooperates with the coupling means to rotate the mounting plate 18 prior to the large gear 16 as the second power transmission wheel.

A photosensor 22 as a position sensor is attached to the upper end portion of the mounting plate 18. This photosensor 22 detects a shutter 23 attached to a side portion of the large gear 16. The shutter 23 is so arranged that the photosensor 22 detects a position before a locking position at which the test head 5 swings and comes in contact with the contact terminals of the probe card 8. On the basis of a position detection signal from the photosensor 22, the controller 17 stops the motor 14 and drives the electromagnetic brake 14A attached to the motor 14, thereby stopping the swing of the test head 5 and holding the test head 5 at that stop position. In this way the controller 17 cooperates with the electromagnetic brake to constitute a control means for stopping the driving of the motor.

FIG. 2A shows a complementary torque apply means and a holding means for holding the object to be swingably supported in the swing stop position. The complementary torque apply means include a locking piece 24 fixed to one end of the object to be swingably supported and a clamp mechanism 26 arranged on the side edge of the upper surface of the probe system main body 2. That is, after the test head 5 stops immediately before the position where the test head 5 contacts the probe card 8, the clamp mechanism 26 rotates in a direction opposite to a direction indicated by the arrow under the control of the controller 17. Consequently, a push arm of the clamp mechanism 26 pushes the locking piece 24. This push applies a complementary torque to the object to be swingably supported, and the object rotates toward a locking member 25 arranged on the side edge of the upper surface of the probe system main body 2. The locking piece 24 abuts against the locking member 25 and stops.

The holding means for holding the object to be swingably supported in the stop position include the locking piece 24, the clamp mechanism 26, and the locking member 25. After the locking piece 24 abuts against the locking member 25 and stops, this locking piece 24 is pushed against the locking member 25 by a clamping member formed at the end of the clamp mechanism and thereby clamped and held by the clamping member. As a consequence, the test head 5 is reliably held in the position where the test head 5 is electrically connected to the probe card 8.

When the test head 5 is to be swung upward from the probe system main body 2 (in a direction indicated by the arrow in FIGS. 1 and 2A), the clamp mechanism 26 rotates in the arrow direction to release the test head 5 under the control of the controller 17.

Individual operations of the mounting member pre-rotating means will be described below with reference to FIGS. 1, 5A, 5B, and 5C.

Figure 5A:
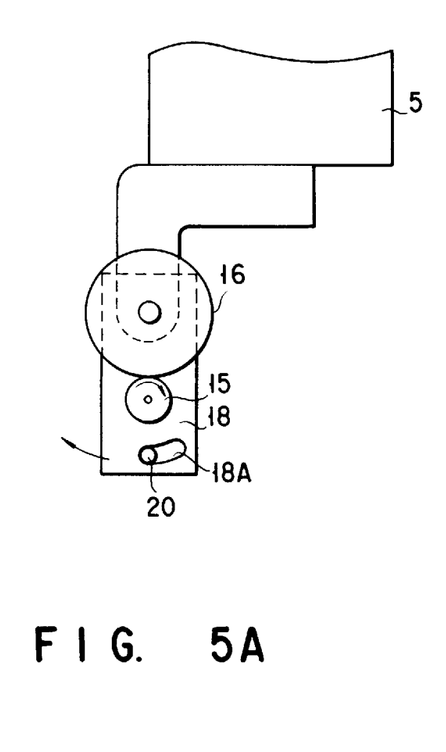
FIGS. 5A, 5B, and 5C are views for-explaining the operation of the mounting member pre-rotating means shown in FIGS. 3 and 4, which are rear views of FIG. 2A.
Figure 5B:
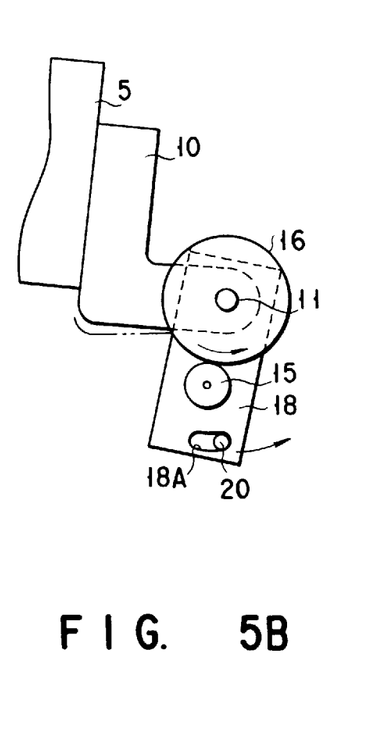
Figure 5C:
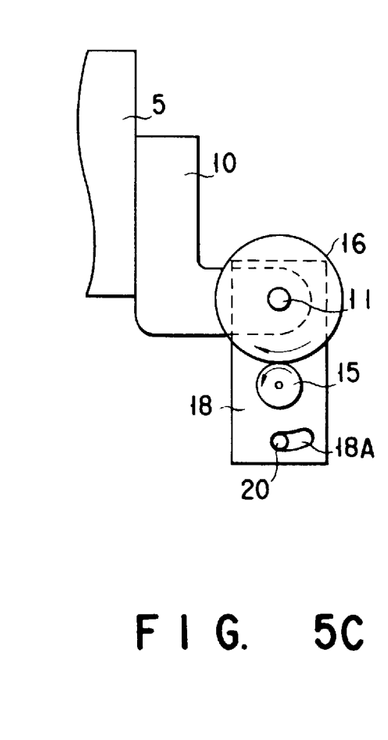

FIGS. 5A, 5B, and 5C are rear views of the probe system shown in FIG. 1.

When the semiconductor wafer W is to be electrically tested by using the probe system 1 shown in FIG. 1, the test head 5 is swiveled 180° from the maintenance area 4 and electrically connected to the probe card 8 of the probe system main body 2 via the connection ring. The wafer table 6 having the semiconductor wafer W chucked thereon is moved in the X, Y, and q directions via another table (not shown), thereby positioning the electrode pads of an IC chip formed on the semiconductor wafer W with respect to the probe needles 8A of the probe card 8. Thereafter, the wafer table 6 is over-driven in the Z direction to electrically connect the probe needles 8A to the electrode pads of the IC chip formed on the semiconductor wafer W. A test signal is supplied to an IC chip or chips to electrically test the IC chip.

When the test head 5 extends nearly horizontally toward the maintenance area 4 (when the test head 5 swings 180° from the position shown in FIG. 1), the pin 29C of the gas spring 29A of each torque reducing mechanism 27 is in a position P1 shown in FIG. 2A. Meanwhile, the pin 29B at the lower end of the gas spring 29A is positioned in the upper portion of the elongated hole 32A of the guide plate 32. In this state, the gas spring 29A pushes the piston rod by the internal gas pressure of the cylinder and gives the wires 29D a tensile force in the direction of an arrow A, thereby applying a torque to the flange 28. Since this torque cancels the torque applied on the rotating shaft 11 by the weight of the test head 5, the two torques balance each other.

As described above, when the motor 14 is driven to swing the test head 5 toward the probe system main body 2 from the state in which the test head 5 extends nearly horizontally to the maintenance area 4, the motor 14 can swing the test head 5 with a small driving force because the torque on the rotating shaft is decreased by the torque reducing mechanism. When the test head 5 reaches the upper dead center (a position shown in FIG. 5A), the direction of the torque acting on the test head 5 changes from counterclockwise to clockwise at that point. At this time, the pin 29C of the flange 28 of the torque reducing mechanism 27 is in a position indicated by P2 in FIG. 2A.

When the motor 14 is activated to further swing the test head 5 counterclockwise from the upper dead center (the state shown in FIG. 5A) toward the probe system main body 2, the small gear 15 rotates clockwise as indicated by the arrow shown in FIG. 5A. Accordingly, the small gear 15 acts to rotate the large gear 16 counterclockwise, but the large gear 16 does not rotate due to the mounting member pre-rotating means described above. Consequently, the mounting plate 18 is rotated clockwise by the motor 14 around the boss 16A of the large gear 16 as indicated by the arrow. In this way the mounting plate 18 is rotated the length of the elongated hole 18A of the mounting plate 18 before the test head 5 swings.

Thereafter, as shown in FIG. 5B, the positioning pin 20 engages with the right-hand end of the elongated hole 18A to prevent the mounting plate 18 from further rotating. The driving force of the motor 14 is transmitted to the rotating shaft 11 via the small and large gears 15 and 16, and the test head 5 swings counterclockwise toward the probe system main body 2. When the test head 5 keeps turning, the photosensor 22 of the mounting plate 18 detects the shutter 23 of the large gear 16 and generates a detection signal. Upon receiving this detection signal, the controller 17 stops the motor 14 and activates the electromagnetic brake, thereby stopping the test head 5, while the test head 5 is kept slightly inclined, in a position (before a position where the test head 5 contacts the probe card 8) indicated by the solid lines in FIG. 5B.

When the test head 5 comes to a halt, the clamp mechanism 26 operates and its arm pushes the locking piece 24 to complementarily further rotate the test head 5 counterclockwise from the position indicated by the solid lines in FIG. 5B toward the probe system main body 2. At this time, the large gear 16 rotates counterclockwise, but the small gear 15 cannot rotate because it is held by the electromagnetic brake. Consequently, the mounting plate 18 rotates together with the test head 5 in a direction indicated by the arrow in FIG. 5B, and the positioning pin 20 engages with the left-hand end of the elongated hole 18A as shown in FIG. 5C. The locking piece 24 of the test head 5 is pushed against the locking member 25 and clamped by the clamping member of the clamp mechanism 26. This allows the test head 5 to reach the position where the test head 5 is electrically connected to the probe card 8 via the connection ring 9. The distance the test head 5 complementarily further rotates equals the distance the mounting plate 18 moves prior to the test head 5. In other words, the distance the mounting plate 18 moves beforehand is complemented by the distance the test head 5 is complementarily further rotated by the clamp operation.

When a predetermined test is complete, the rotating shaft is rotated in the reverse direction to swing the test head 5 clockwise toward the maintenance area. At this time the small gear 15 rotates counterclockwise as indicated by the arrow in FIG. 5C. However, since the positioning pin 20 engages with the left-hand end of the elongated hole 18A, the mounting plate 18 does not swing from the state shown in FIG. 5C. Consequently, the rotating shaft and the test head 5 rotate clockwise without temporarily stopping and return to the start position where they have started swinging.

As described above, in the swing support apparatus 3 of the conventional probe system 1 equipped with the torque reducing mechanism 27, the driving force of the motor 14 can be decreased to be far smaller than that of conventional systems. Accordingly, the motor 14 and the gears 15 and 16 can be miniaturized, and the cost can be reduced. Additionally, even if the motor 14 breaks down, the torque reducing mechanism 27 prevents an abrupt fall of the test head 5, improving the safety of the system. Furthermore, a very simple member, i.e., the gas spring mechanism 29, is used as the torque reducing mechanism 27. This further reduces the cost in cooperation with the miniaturization of the motor 14 and the like.

The invention described in claim 1 further improves the conventional probe system 1 equipped with the torque reducing mechanism 27. That is, this invention provides a swing support apparatus capable of reliably positioning a heavy object without any overload by using the temporary stopping means, the rotation complementing means, and the holding means in addition to the torque reducing mechanism 27.

The invention described in claims 2, 3, and 4 provides an apparatus whose swing support function is further improved by using the motor as the driving means or by using the fixed member fixed to the rotating shaft, the gas spring, and the connecting members as the torque reducing mechanism.

The invention described in claim 5 provides an apparatus comprising, as the rotation complementing means, the coupling means for coupling the mounting member to the second power transmission wheel, the rotation angle regulating means, the mounting member pre-rotating means, and the complementary torque apply means. Unlike a conventional positioning mechanism using the driving force of the motor 14, positioning control is simplified. Therefore, the apparatus can accurately position an object to be swingably supported in a predetermined swing position without any overload by using a very simple and inexpensive mechanism.

The invention described in claims 6, 7, 8, 9, and 10 improves the temporary stopping means, the coupling means, the rotation angle regulating means, the complementary torque apply means, or the holding means of the invention described in claim 5. That is, this invention provides an apparatus in which the temporary stop function, the function of coupling the mounting member to the second power transmission wheel, the function of regulating the rotation angle of the mounting member, the complementary torque apply function, or the function of stopping and holding an object to be swingably supported in a stop position of the invention described in claim 5 is further improved with a very simple and inexpensive mechanism.

The invention described in claims 11 to 20 uses the swing support apparatus described in claims 1 to 10 as a swing support apparatus for swingably supporting a testing device in a test system for testing electrical characteristics. This invention makes use of the advantages of the swing support apparatus described in claims 1 to 10 in a test system and thereby provides a test system capable of reliably positioning even a heavy testing device without any overload by using a very simple and inexpensive mechanism.

The present invention is not limited to the above embodiment. For example, as the swing support apparatus described in claims 1 to 9, a test system (probe system) for performing a probe test in the field of semiconductors is explained. However, the swing support apparatus of the present invention is not limited to this test system but is widely applicable to any system required to support and position an object to be swung. The swing support apparatus described in claims 10 to 19 is also not limited to a test system (probe system) for performing a probe test in the field of semiconductors. That is, this swing support apparatus can also be applied to general test systems required to support and position an object to be swung.

Furthermore, design of each component can be properly changed where necessary. For example, the fixed member in the torque reducing mechanism need only be a structure which can transmit the tension from the connecting members to the rotating shaft; i.e., the fixed member need not be a so-called flange. In the rotation angle regulating means of the above embodiment, the elongated hole 18A of the mounting member pre-rotating means 21 is formed in the mounting plate 18, and the positioning pin 20 is formed on the side plate of the support base 12. However, it is also possible to form the positioning pin on the mounting plate 18 and the elongated hole in the side plate. The hole in which the positioning pin is loosely fitted need not be an elongated hole. A motor can also be used as the rotation complementing means. As the clamp mechanism, it is possible to use a plurality of clamp mechanisms or a mechanism having a vertically movable arm instead of a rotary arm.

Moreover, although the contact surfaces of the locking piece 24 and the locking member 25 can be flat surfaces, it is also possible to improve the positioning accuracy by using complementary, concave and convex surfaces.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A swing support apparatus comprising:
    an apparatus main body;
    an object to be swingably supported which is swung around said apparatus main body;

a rotating shaft fixed to said object;

support means for rotatably supporting said rotating shaft on said apparatus main body;

driving means for rotating said rotating shaft such that said object swings between a swing start position separated from said apparatus main body and a swing stop position close to said apparatus main body;

torque reducing means for reducing a torque applied on said rotating shaft by said object;

temporary stopping means for temporarily stopping the swing of said object in a temporary stop position before the swing stop position;

rotation complementing means for complementarily further swinging said object from the temporary stop position to the swing stop position; and holding means for holding said object in the swing stop position.

2. An apparatus according to claim 1, wherein said driving means comprises a motor having a driving shaft, a mounting member on which said motor is fixed, a first power transmission wheel fixed on said driving shaft of said motor, and a second power transmission wheel fixed on a portion of said rotating shaft to engage with said first power transmission wheel and transmit a driving force of said motor to said rotating shaft.

3. An apparatus according to claim 1, wherein said torque reducing means comprises fixed members fixed on said rotating shaft, gas springs each having a piston rod and extending perpendicularly to said rotating shaft, and connecting members each of which connects one end of the piston rod of each gas spring to the fixed member, whereby a reducing torque for reducing the torque (load) applied on said rotating shaft is applied by said object to said fixed members via said connecting members.

4. An apparatus according to claim 1, wherein said driving means comprises a motor having a driving shaft, a mounting member on which said motor is fixed, a first power transmission wheel fixed on said driving shaft of said motor, and a second power transmission wheel fixed on said rotating shaft to engage with said first power transmission wheel and transmit a driving force of said motor to said rotating shaft, and said torque reducing means comprises fixed members fixed on said rotating shaft, gas springs extending perpendicularly to said rotating shaft, and connecting members for connecting one end of a piston rod of each gas spring to said fixed member, and applies a reducing torque for reducing the torque applied on said rotating shaft by said object to said fixed members via said connecting members.

5. An apparatus according to claim 1, wherein said rotation complementing means comprises:

a) coupling means for coupling said mounting member to said second power transmission wheel such that said mounting member freely rotates in both forward and reverse directions with respect to said second power transmission wheel;

b) rotation angle regulating means for regulating an angle range within which said mounting member can freely rotates in the forward and reverse directions with respect to said second power transmission wheel;

c) mounting member pre-rotating means for allowing said driving means to rotate said mounting member within the angle range prior to said second power transmission wheel, and driving said second power transmission wheel after said mounting member stops rotating by said rotation angle regulating means; and d) complementary torque apply means for applying a complementary torque to said object in the temporary stop position and complementarily further rotating said object from the temporary stop position to the swing stop position.

6. An apparatus according to claim 5, wherein said coupling means has a structure in which a) said mounting member has a loose fit hole, b) said second power transmission wheel has a boss, and c) said mounting member is rotatably supported by inserting said boss of said second power transmission wheel into the loose fit hole of said mounting member.

7. An apparatus according to claim 5, wherein said rotation angle regulating means comprises a) a side plate, b) said mounting plate having an elongated hole, and c) a positioning pin so positioned and fixed on said side plate as to loosely fit in the elongated hole of said mountingp plate.

8. An apparatus according to claim 5, wherein said complementary torque apply means comprises a locking piece formed on said object, and a clamp mechanism having a push arm for pushing said locking piece to apply the complementary torque to said object.

9. An apparatus according to claim 5, wherein said holding means comprises a locking piece formed on said object, a locking member provided in the swing stop position, and a clamp mechanism having a push arm for clamping said locking piece abutting against said locking member together with said locking member and holding said object in the stop position.

10. An apparatus according to claim 5, wherein said coupling means has a structure in which a) said mounting member has a loose fit hole, b) said second power transmission wheel has a boss, and c) said mounting member is rotatably supported by inserting said boss of said second power transmission wheel into the loose fit hole of said mounting member, said rotation angle regulating means comprises a) a side plate provided on a pair of said support bases, b) said mounting plate having an elongated hole, and c) a positioning pin so positioned and fixed on said side plate as to loosely fit in the elongated hole of said mounting member, said complementary torque apply means comprises a) a locking piece formed on said object, and b) a clamp mechanism having a push arm for pushing said locking piece to apply complementary torque to said object, and said holding means comprises a) a locking piece formed on said object, b) a locking member provided in the swing stop position, and c) a clamp mechanism having a push arm for clamping said locking piece abutting against said locking member together with said locking member and holding said object in the stop position.

11. A swing support apparatus comprising:

an apparatus main body;

an object to be swingably supported which is swung around said apparatus main body and has a testing device;

a rotating shaft fixed to said object;

support means for rotatably supporting said rotating shaft on said apparatus main body;

driving means for rotating said rotating shaft such that said object swings between a swing start position separated from said apparatus main body and a swing stop position close to said apparatus main body;

torque reducing means for reducing a torque applied on said rotating shaft by said object;

temporary stopping means for temporarily stopping the swing of said object in a temporary stop position before the swing stop position;

rotation complementing means for complementarily further rotating said object from the temporary stop position to the swing stop position; and holding means for holding said object in the swing stop position.

12. An apparatus according to claim 11, wherein said driving means comprises a motor having a driving shaft, a mounting member on which said motor is fixed, a first power transmission wheel fixed on said driving shaft of said motor, and a second power transmission wheel fixed on said rotating shaft to engage with said first power transmission wheel and transmit a driving force of said motor to said rotating shaft.

13. An apparatus according to claim 11, wherein said torque reducing means comprises fixed members fixed on said rotating shaft, gas springs arranged perpendicularly to said rotating shaft, and connecting members for connecting one end of a piston rod of each gas spring to said fixed member, and applies a reducing torque for reducing the torque applied on said rotating shaft by said object to said fixed members via said connecting members.

14. An apparatus according to claim 11, wherein said rotation complementing means comprises:

a) coupling means for coupling said mounting member to said second power transmission wheel such that said mounting member can freely rotate in both forward and reverse directions with respect to said second power transmission wheel;

b) rotation angle regulating means for regulating an angle range within which said mounting member can freely rotate in the forward and reverse directions with respect to said second power transmission wheel;

c) mounting member pre-rotating means for allowing said driving means to rotate said mounting member within the angle range prior to said second power transmission wheel, and driving said second power transmission wheel after said mounting member stops rotating due to said rotation angle regulating means; and d) complementary torque apply means for applying a complementary torque to said testing device in the temporary stop position and complementarily further rotating said object from the temporary stop position to the swing stop position.

15. An apparatus according to claim 14, wherein said coupling means has a structure in which a) said mounting member has a loose fit hole, b) said second power transmission wheel has a boss, and c) said mounting member is rotatably supported by inserting said boss of said second power transmission wheel into the loose fit hole of said mounting member.

16. An apparatus according to claim 14, wherein said rotation angle regulating means comprises a) a side plate provided on a pair of said support bases, b) said mounting plate having an elongated hole, and c) a positioning pin so positioned and fixed on said side plate as to loosely fit in the elongated hole of said mounting member.

17. An apparatus according to claim 14, wherein said complementary torque apply means comprises a locking piece formed on said object, and a clamp mechanism having a push arm for pushing said locking piece to apply the complementary torque to said object.

18. An apparatus according to claim 14, wherein said holding means comprises a locking piece formed on said object, a locking member provided in the stop position, and a clamp mechanism having a push arm for clamping said locking piece abutting against said locking member together with said locking member and holding said object in the stop position.

19. An apparatus according to claim 14, wherein said coupling means has a structure in which a) said mounting member has a loose fit hole, b) said second power transmission wheel has a boss, and c) said mounting member is rotatably supported by inserting said boss of said second power transmission wheel into the loose fit hole of said mounting member, said rotation angle regulating means comprises a) a side plate provided on a pair of said support bases, b) said mounting plate having an elongated hole, and c) a positioning pin so positioned and fixed on said side plate as to loosely fit in the elongated hole of said mounting member, said complementary torque apply means comprises a) a locking piece formed on said object, and b) a clamp mechanism having a push arm for pushing said locking piece to apply a complementary torque to said object, and said holding means comprises a) a locking piece formed on said object device, b) a locking member provided in the swing stop position, and c) a clamp mechanism having a push arm for clamping said locking piece abutting against said locking member together with said locking member and holding said object in the swing stop position.

20. An apparatus according to claim 14, wherein an object to be tested includes a part relating to a semiconductor device, and said testing device of said object to be swingably supported is a test head.

* * * * *

UNITED STATES PATENT AND TRADEMARK OFFICE
CERTIFICATE OF CORRECTION

PATENT NO. : 5,886,488
DATED : March 23, 1999
INVENTOR(S) : Hisashi NAKAJIMA, et al.

It is certified that error appears in the above-identified patent and that said Letters Patent is hereby corrected as shown below:

On the title page, in Item [75], the second inventor's city of residence should read:

--Kofu--

Signed and Sealed this

Fourteenth Day of December, 1999

Attest:

Q. TODD DICKINSON

Attesting Officer

Acting Commissioner of Patents and Trademarks